United States Patent [19]
Sharma et al.

[11] Patent Number: 5,846,615
[45] Date of Patent: Dec. 8, 1998

[54] DIRECT DEPOSITION OF A GOLD LAYER

[75] Inventors: Sunity Kumar Sharma, Palo Alto; Kuldip Kumar Bhasin, Mountain View; Subhash C. Narang, Palo Alto, all of Calif.

[73] Assignee: The Whitaker Corporation, Wilmington, Del.

[21] Appl. No.: 808,376

[22] Filed: Feb. 28, 1997

[51] Int. Cl.$^6$ .............................. B05D 3/06; B05D 3/02
[52] U.S. Cl. ..................... 427/597; 427/226; 427/125
[58] Field of Search ..................... 427/266, 125, 427/596, 597

[56] References Cited

U.S. PATENT DOCUMENTS

| | | | |
|---|---|---|---|
| 4,042,392 | 8/1977 | Gysling et al. | 96/48 PD |
| 4,046,569 | 9/1977 | Gysling et al. | 96/48 PD |
| 4,152,155 | 5/1979 | Lalental et al. | 96/48 PD |
| 4,176,085 | 11/1979 | Yoo et al. | 252/428 |
| 4,715,935 | 12/1987 | Lovie et al. | 204/44.6 |
| 4,933,204 | 6/1990 | Warren, Jr. et al. | 427/53.1 |
| 5,021,398 | 6/1991 | Sharma et al. | 505/1 |
| 5,179,060 | 1/1993 | Subramanian et al. | 502/332 |
| 5,281,447 | 1/1994 | Brady et al. | 427/555 |
| 5,491,005 | 2/1996 | Hoshino | 427/576 |
| 5,589,425 | 12/1996 | Hoshino et al. | 427/250 |

OTHER PUBLICATIONS

Gozum, et al., J. Am. Chem. Soc. vol. 110, pp. 2688–2689, 1988, "Tailored Organometallics as Precursors for the Chemical Vapor Deposition of High–Purity Palladium and Platinum Thin Films".

Longenberger and Mills, J. Phys. Chem., vol. 99, pp. 475–478, 1995, "Formation of Metal Particles in Aqueous Solutions by Reactions of Metal Complexes with Polymers".

Baum and Jones, J. Vac. Sci. Tech. B, vol. 4, pp. 1187–1191, 1986, "Laser chemical vapor deposition of gold: part II".

Baum, J. Electrochem. Soc., vol. 134, pp. 2616–2619, 1987, "Laser Chemical Vapor Deposition of Gold".

Ye and Hunsperger, Appl. Phys. Lett., vol. 51, pp. 2136–2138, 1987, "Ultravioloet–light–induced deposition of gold films".

Gross, et al., J. Appl. Phys., vol. 60, pp. 529–533, 1986, "A chemical and mechanical view of reaction profiles in laser direct–write metallization in metal–organic films. Gold".

Berry, et al., Sensors and Actuators A, vol. 51, pp. 47–50, 1995, "The production of fine metal tracks from a new range of organometallic compounds".

Baum, Jones, Appl. Phys. Lett., vol. 47, pp. 538–540, 1985 "Laser chemical vapor deposition of gold".

Baum and Marinero, Appl. Phys. Lett., vol. 49, pp. 1213–1215, 1986, "Projection printing of gold micropatterns by photochemical decomposition".

Davidson, et al., Chem. Mater., vol. 6, No. 10, 1994, pp. 1712–1725, "Laser Photochemical Deposition of Gold from Trialkylphosphine Alkylgold(I) Complexes".

Berry, et al., J. Mat. Sci. Lett., vol. 14, pp. 844–846, 1995, "New material for the production of fine line interconnects in integrated circuit technology".

Nakoa, and Sone, Chem. Commun., 1996. pp. 897–898. "Reversible dissolution/deposition of gold in iodine–iodide––acetonitrile systems".

Nakao J. Chem. Soc., Chem. Commun., 1992. pp. 426–427. "Dissolution of Noble Metal in Halogen–Halide–Polar Organic Solvent System".

*Primary Examiner*—Roy V. King
*Attorney, Agent, or Firm*—Mary K. VanAtten

[57] ABSTRACT

A process for forming a layer of gold on a substrate, comprising: preparing a solution of a gold precursor wherein the gold precursor consists of $$Au(OH)_p(OOCR^1)_q(OOCR^2)_r$$

wherein $R^1$ is selected from the group of hydrogen, alkyl, alkenyl, and alkynyl, and $R^2$ is selected from the group of hydrogen, alkyl from 2 to 10 carbon atoms, alkenyl, or alkynyl, and p+q+r=3. Applying the solution of the gold precursor to the surface of the substrate. Decomposing the gold precursor by subjecting the gold precursor to heat.

10 Claims, No Drawings

DIRECT DEPOSITION OF A GOLD LAYER

FIELD OF THE INVENTION

The invention is directed to a process for directly depositing a layer of gold on a substrate.

BACKGROUND OF THE INVENTION

Gold compounds have been used in printing and for depositing conductive gold lines in microelectronic circuits. For example, in U.S. Pat. No. 4,933,204, a method is shown for depositing gold features on a substrate. Gold(III) hydroxide is dissolved in acetic acid to form gold(III) acetate. Gold features were then formed by casting the gold(III) acetate film on a suitable substrate such as silicon, and then traversing the film with a laser in the locations where it is desired to produce the conducting lines. The laser was operated at a power and speed sufficient to heat the traversed locations to a temperature above about 175° C. The gold(III) acetate was decomposed under the heat from the laser to release a layer of gold on the surface of the substrate and release the acetate.

A limitation of this method is that the substrate needs to be heated to 175° C. Further, the flexibility of this system is limited by the solubility of the gold(III) acetate in different solvents for the application to the substrate.

U.S. Pat. No. 5,021,398 shows the synthesis of several metallo carboxylates such as strontium 2-allylhexanoate and barium 2-allylhexanoate. These dimethacrylate compounds are soluble at ambient conditions in polar organic solvents. Furthermore, metallo carboxylates wherein two or more of the acids are of different chain lengths, i.e. unsymmetrical metallo carboxylates, are much more soluble in the organic solvents than their symmetrical counterparts.

What is needed is a gold complex which will decompose to give a gold film at a much lower temperature. Further, what is needed is a gold precursor with increased solubility in a solvent suitable for the deposition of a gold layer.

SUMMARY OF THE INVENTION

In one aspect, the present invention relates to a process for forming a layer of gold on a substrate, comprising:

preparing a solution of a gold precursor wherein the gold precursor consists of

wherein
$R^1$ is selected from the group of hydrogen, alkyl, alkenyl, alkynyl,
$R^2$ is selected from the group of hydrogen, alkyl from 2 to 10 carbon atoms, alkenyl, alkynyl;
applying the gold precursor to the surface of the substrate;
decomposing the gold precursor by subjecting the gold precursor to heat.

It is an object to provide a non vacuum technique for depositing a gold film.

It is a further object to provide a mild method for depositing a gold film on a substrate.

It is a further object to provide an environmentally benign process releasing only environmentally benign byproducts, such as water and carbon dioxide, as main products of the decomposition of the precursor.

DETAILED DESCRIPTION OF THE INVENTION

As used herein:

"alkyl" refers to alkyl groups having from 1 to 10 carbon atoms, unless otherwise specified;

"alkenyl" refers to organic groups having 1 to 10 carbon atoms and at least one double bond, the unsaturation can be at any location;

"alkynyl" refers to organic groups having 1 to 10 carbon atoms and at least one triple bond.

It has been discovered that gold(III) carboxylates, and preferably mixed gold(III) carboxylates can be used to form a gold film under very mild conditions. Casting films of the solution results in a film of gold(III) carboxylates. The gold film precursors that the film is prepared from have the formula:

where:

p, q and r are real numbers or fractions, p1 p+q+r=3.

The gold precursors are typically formed from gold(III) hydroxide in a manner known in the art. An example of a method to form metallo carboxylates is shown in U.S. Pat. No. 5,021,398, which is herein incorporated by reference. The gold precursors are readily soluble in polar solvents such as ethyl acetate, DMSO, etc. The gold precursors can be applied directly to a substrate in these solvents for the formation of the gold film.

The gold precursors are formed in situ, within the solution which is to be applied to the substrate. Therefore, the exact ratio of the substituents is not determined. The compounds can be used directly without isolating and determining the ratio of the substituents. It is only important that the amount of gold present in the solution is known.

The substrate on to which the gold can be deposited can be a metallic material which would typically be electroplated. The precursor can also be used on several other types of material that can not be electroplated. These other substrates are plastics, ceramics, glasses, silicon wafers, cellulose, graphite and paper substrates. Specific applications of this process can be used for placing a gold layer on electrical contacts, multi-chip modules, printed wiring boards and PCMCIA cards. The process presents an alternative to not only electroplating, but also to vacuum deposition techniques.

The gold film precursor can be applied to the substrate using a variety of different application techniques. The choice of a particular technique depends on the end use and mode of production. The precursor can be applied using any one, or a combination, of the following techniques: ink-jet printing, screen printing, spray coating, spin coating, puddle coating, dip coating, brush coating, or various other coating techniques.

Surface pretreatment of the substrate is not absolutely necessary before applying the precursor, however, the gold film adhesion to the substrate may be better if the surface is first activated by removal of grit, dust, grease and other contaminates, prior to application of the precursor solution.

In order to improve the film forming properties of the solution, a small amount of a non-ionic surfactant may be added to the solution of the gold precursor. For example, TRITON X 100 (commercially available from Fluka Chemie AG) can be added to the solution of the precursor. Only a small amount surfactant is added to the solution. For example, less than 0.1 by weight of the surfactant would be added to the solution of the gold precursor. There are many other commercially available surfactants that can be used in the process During pyrolysis of the gold precursor, the surfactant will decompose. Alternatively, the surface of the substrate, following pyrolysis, can be washed with an organic solvent to remove any remaining organics or surfactants.

Furthermore, the surface of the substrate to be coated with the gold precursor can be first treated with the non-ionic surfactant to allow better adhesion of the gold layer to the substrate. As an alternative, the surface of the substrate to be coated with the gold precursor solution may be pretreated with a reducing agent, such as formic acid or vitamin C.

The precursor solution can be converted to a gold film by heating it to a temperature above about 80° C., and in some cases, to above about 100° C. This can be accomplished by exposing the solution, in air, to a hot air gun, a laser, or a heat lamp. The temperature that is required to decompose the gold precursor depends on the individual precursor. For example, acetato isobutyrado gold(III) hydroxide will decompose slowly at 80° C. to form a gold layer. However, at 100° C., the decomposition will be very fast. Other gold carboxylates will decompose at higher or lower temperatures, depending on the substituents on the gold. For example, thermal analysis of

$$Au(OH)_p(OOCH_3)_q(OOCCH(CH_3)_2)_r(H_2O)_m(CH_3COOH)_n((CH_3)_2CHCOOH)_o$$

shows that the compound mainly decomposes at approximately 75° C. and has a second decomposition peak at approximately 100° C.

The choice of a particular gold precursor is dependent upon the substrate to which the gold layer will be applied and how the substrate will stand up under a particular decomposition temperature. Acetato isobutyrato gold(III) hydroxide is particularly well suited for application of a gold layer onto sensitive substrates such as paper or plastic. Other substrates can withstand higher temperatures and therefore a laser could be used to decompose the gold precursor. The length of time needed to decompose the gold precursor will be dependent upon the gold precursor and the power of the laser.

The process herein described could also be used to apply a gold layer to a specific area of the substrate. To accomplish this, the surface of the substrate would be coated with the gold precursor. The laser would then be directed toward particular parts of the substrate in order to decompose the gold precursor on only those parts of the substrate. Once the decomposition of the specific areas of the gold precursor was completed, the surface of the substrate would then be washed to remove any unreacted gold precursor leaving a gold layer in only those areas that were exposed to the laser.

After a first layer of gold is deposited on the surface of the substrate, it is possible to apply subsequent layers of gold to the surface by repeating the process. Furthermore, it is possible to apply a thicker coating of the gold precursor to the substrate in order to deposit a thicker layer of gold to the substrate in one step.

Examples of methods used to form the gold carboxylates and a gold deposit from the film are given below.

EXAMPLE 1
Preparation of gold(III) hydroxide.

Anhydrous gold(III) chloride was prepared by chlorinating chloroauric acid ($HAuCl_4$) in a slow stream of chlorine gas at 130°–140° C. Chloroauric acid in turn was prepared from metallic gold with aqua regia. 2.0 gm of $AuCl_3$ was dissolved in 50 ml deionised water to give a golden yellow solution. To the stirred solution was added basic magnesium carbonate in small portions till no more effervescence occurred. This nearly consumed 4.25 g of basic magnesium carbonate. The solution was stirred for 10 hrs at room temperature. The solution was filtered and the residue was repeatedly washed with 0.1N $H_2SO_4$ till no more unreacted carbonate was left. The residue was then washed with water to remove any remaining acid. The residue was then kept in the freezer.

EXAMPLE 2
Preparation of acetato isobutyrato gold(III) hydroxide

To 5.0 gm of the hydrated gold(III) hydroxide obtained above was added dropwise to a mixture consisting of 15 ml of acetic acid and 3 ml isobutyric acids. The reaction mixture was heated at 50°–55° C. for 3–4 hours till near complete dissolution of the gold(III) hydroxide. The solution may still have brownish turbidity. It was filtered through a microfilter (0.2 μm) and a clear golden solution of the precursor was obtained. The solution was concentrated to about 5 ml and a dark brownish-golden solution resulted which is ready for use to make the metallic gold film. The solution should be protected from light and kept in the freezer.

EXAMPLE 3

The solution was applied to the substrate by puddle coating, that is, the solution was poured onto the substrate and then spread over the surface of the substrate. The substrate was allowed to dry for a couple of seconds to a minute. The substrate was then placed in front of a hot air gun for less than two minutes to decompose the gold precursor and blow off any organic material produced from the decomposition of the gold precursor.

The gold layer had good electrical conductivity and wear resistance.

The preferred embodiments of this invention have been illustrated by the examples described above. Modifications and additional embodiments, however, will undoubtedly be apparent to those skilled in the art. Furthermore, equivalent elements may be substituted for those illustrated and described herein, and certain features of the invention may be utilized independently of other features. Consequently, the exemplary embodiments should be considered illustrative, rather than inclusive, while the appended claims are more indicative of the full scope of the invention.

What is claimed is:

1. A process for forming a layer of gold on a substrate, comprising:

preparing a solution of a gold precursor wherein the gold precursor consists of

$$Au(OH)_p(OOCR^1)_q(OOCR^2)_r$$

wherein
$R^1$ is selected from hydrogen, alkyl, alkenyl, or alkynyl,
$R^2$ is selected from hydrogen, alkyl from 2 to 10 carbon atoms, alkenyl, or alkynyl,
p+q+r=3, wherein p, q and r are real numbers or fractions, and p is less than 3 and q is less than 3;
applying the solution of the gold precursor to the surface of the substrate; and
decomposing the gold precursor by subjecting the gold precursor to heat.

2. The process of claim 1, wherein $R^1$ is methyl and $R^2$ is —$CH(CH_3)CH_2CH_3$.

3. The process of claim 2, wherein the gold precursor is heated to about 80° C.

4. The process of claim 3, wherein the gold precursor is heated with a hot air gun.

5. The process of claim 1, wherein the gold precursor is heated with a hot air gun.

6. The process of claim 1, wherein the gold precursor is heated with a laser.

7. The process of claim 1, wherein $R^1$ is not equal to $R^2$.

8. The process of claim 1, wherein the composition of the substrate is selected from the group consisting of metal, plastic, glass, paper, silicon wafer, graphite, and cellulose materials.

9. The process of claim 1, wherein a surfactant is added to the solution of the gold precursor prior to application to the substrate.

10. The process of claim 1, wherein $R^1$ has at least 2 carbon atoms and $R^1$ is equal to $R^2$.

* * * * *